(12) United States Patent
Chen et al.

(10) Patent No.: US 10,529,707 B2
(45) Date of Patent: Jan. 7, 2020

(54) INTRA-METAL CAPACITOR AND METHOD OF FORMING THE SAME

(71) Applicant: UNITED MICROELECTRONICS CORP., Hsin-Chu (TW)

(72) Inventors: Hsin-Hsien Chen, New Taipei (TW); Sheng-Yuan Hsueh, Tainan (TW); Yi-Chung Sheng, Tainan (TW); Chih-Kai Kang, Tainan (TW); Wen-Kai Lin, Yilan County (TW); Shu-Hung Yu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/983,096

(22) Filed: May 18, 2018

(65) Prior Publication Data
US 2018/0269201 A1    Sep. 20, 2018

Related U.S. Application Data

(62) Division of application No. 15/365,906, filed on Nov. 30, 2016, now Pat. No. 10,002,864.

(51) Int. Cl.
*H01L 27/06*    (2006.01)
*H01L 21/768*   (2006.01)
*H01L 29/06*    (2006.01)
*H01L 49/02*    (2006.01)
*H01L 23/528*   (2006.01)

(52) U.S. Cl.
CPC .... *H01L 27/0629* (2013.01); *H01L 21/76897* (2013.01); *H01L 23/5283* (2013.01); *H01L 28/60* (2013.01); *H01L 29/0649* (2013.01)

(58) Field of Classification Search
CPC . H01L 21/00; H01L 21/768; H01L 21/76897; H01L 27/06; H01L 27/0629; H01L 27/768; H01L 27/3265; H01L 27/10829; H01L 27/10861; H01L 27/10838; H01L 27/10855; H01L 27/10867; H01L 27/10876; H01L 27/0805; H01L 27/101; H01L 27/0727; H01L 27/7687; H01L 27/0733; H01L 27/0794; H01L 29/00; H01L 29/0649; H01L 29/945; H01L 29/66181; H01L 21/321; H01L 21/311; H01L 21/285; H01L 21/3213; H01L 21/32115; H01L 21/76802; H01L 21/28568; H01L 21/76877; H01L 21/32139; H01L 21/31144
USPC ......... 257/296; 438/238, 239, 250, 243, 244
See application file for complete search history.

(56) References Cited

U.S. PATENT DOCUMENTS

| | | |
|---|---|---|
| 6,417,556 B1 | 7/2002 | Long |
| 6,765,778 B1 | 7/2004 | Du |
| 6,882,015 B2 | 4/2005 | Bernstein |

(Continued)

*Primary Examiner* — Chuong A Luu
(74) *Attorney, Agent, or Firm* — Winston Hsu

(57) ABSTRACT

A method of forming a capacitor includes the following steps. First, a substrate is provided. A dielectric layer is formed over the substrate. A first patterning process is performed to form a first contact plug through the whole thickness of the dielectric layer and a second patterning process is performed to form a second contact plug in the dielectric layer and spaced apart from the first contact plug in a pre-determined distance, wherein the first contact plug and the second contact plug are capacitively coupled.

10 Claims, 9 Drawing Sheets

(56) References Cited

U.S. PATENT DOCUMENTS

| | | |
|---|---|---|
| 9,299,697 B2 | 3/2016 | West |
| 2006/0237819 A1 | 10/2006 | Kikuta |
| 2007/0170548 A1* | 7/2007 | Akamatsu ......... H01L 21/28097 |
| | | 257/532 |
| 2009/0146257 A1* | 6/2009 | Yun .................... H01L 23/5223 |
| | | 257/535 |
| 2010/0038752 A1 | 2/2010 | Ng |
| 2011/0006353 A1* | 1/2011 | Kim .................. H01L 27/10814 |
| | | 257/300 |
| 2016/0233235 A1* | 8/2016 | Miyairi ............... H01L 27/1225 |
| 2017/0069710 A1 | 3/2017 | Che |

\* cited by examiner

INTRA-METAL CAPACITOR AND METHOD OF FORMING THE SAME

CROSS REFERENCE TO RELATED APPLICATIONS

This is a division of U.S. application Ser. No. 15/365,906 filed on Nov. 30, 2016. The above-mentioned applications are included in their entirety herein by reference.

BACKGROUND OF THE INVENTION

1. Field of the Invention

The present invention generally relates to a semiconductor structure, and more particularly to a semiconductor structure comprising an intra-metal capacitor with an adjustable spacing between electrodes.

2. Description of the Prior Art

Passive components such as capacitors are widely used in an integrated circuit. Various types of capacitors may be formed conveniently incorporated with the process of constructing the integrated circuit by modern semiconductor manufacturing technology to fulfill different applications, such as junction capacitors, gate capacitors, and metal-to-poly or metal-to-metal capacitors. Among these various types of capacitors, metal-to-metal capacitors are known for better precision, predictable capacitance linearity and higher breakdown voltage, and therefore have been the mostly adopted type of capacitor in an integrated circuit, especially when a higher capacitance density is demanded.

A metal-to-metal capacitor may be formed by stacking the metal electrodes on top of one another to be the upper electrode and the corresponding lower electrode with an intermediate insulating layer formed therebetween. This kind of metal-to-metal capacitor is known as "an inter-metal capacitor", wherein the metal electrodes are defined (formed) in different metal layers during the process. Extra mask layers and additional process are usually required to form an inter-metal capacitor.

Another kind of metal-to-metal capacitor is "an intra-metal capacitor", wherein the metal electrodes are arranged side-by-side in a dielectric layer wherein the intermediate insulating layer is sandwiched between the sidewalls of adjacent metal electrodes. Please refer to FIG. 1, which is a schematic diagram exemplarily showing the structure of a conventional intra-metal capacitor 15. The electrodes 12 and 14 of the intra-metal capacitor 15 are formed side-by-side in the dielectric layer 16, and are completely separated by the intervening dielectric layer 16, wherein the electrodes 12 and 14 are arranged in such a close proximity to be capacitively coupled through the intervening dielectric layer 16 between their adjacent sidewalls. Conventionally, the electrodes 12 and 14 of the intra-metal capacitor 15 as shown in FIG. 1 are usually defined (formed) in a same metal layer of an interconnecting structure at the same time, such as a layer of metal routing or vias. The process of forming the intra-metal capacitor 15 may be completely integrated with the process of forming the layer of the interconnecting structure. Therefore, extra masks and additional process may be avoided. Furthermore, the sidewall area of the intra-metal capacitor 15 may be enlarged and consequently a larger capacitance may be achieved by, for example, forming conductive structures respectively and directly stacking on the top of the electrodes 12 and 14 in the following process of forming other layers of the interconnecting structure, and eventually building "electrode walls" which are vertically embedded through the layers of the interconnecting structure. In this way, extra layout area required for forming an inter-metal capacitor with a larger capacitance is minimized.

However, since the electrodes 12 and 14 of the intra-metal capacitor 15 are formed at the same time using a single photo mask, the distance 18 between them is constrained to the resolution limitation of the patterning process. In other words, the thickness of the intermediate insulating layer (the dielectric layer 16 between the sidewalls of the electrodes 12 and 14) is constrained to the minimum resolution (or called the minimum pitch) of the patterning process of forming the electrodes 12, 14 and the layer of interconnecting structure, resulting in a limited scalability in device shrinking or a limited capacitance of the capacitor 15. Therefore, there is still a need in the field to provide a novel intra-metal capacitor and the manufacturing process of forming the same which may be formed integrated with the process of forming a semiconductor structure and the spacing between the two electrodes is not constrained to the resolution limitation.

SUMMARY OF THE INVENTION

It is one aspect of the present invention to provide a semiconductor structure comprising an intra-metal capacitor. The semiconductor structure comprises a substrate and a dielectric layer formed thereon. An intra-metal capacitor is formed within the dielectric layer, wherein the intra-metal capacitor comprises a first electrode and a second electrode, and a layer of the dielectric layer with a pre-determined thickness is sandwiched between the first electrode and the second electrode.

According to one embodiment, the top ends of the first electrode and the second electrode are coplanar with the upper surface of the dielectric layer.

According to another embodiment, the bottom end of the first electrode is in direct contact with the substrate, and the bottom end of the second electrode is not in direct contact with the substrate.

It is another aspect of the present invention to provide a method of forming a capacitor. The method of forming the capacitor comprises the following steps. First, a substrate is provided. A dielectric layer is then formed on the substrate. A first patterning process is performed to form a first slot through the whole thickness of the dielectric layer. Subsequently, a second patterning process is performed to form a second slot in the dielectric layer and spaced apart from the first slot in a pre-determined distance. The first slot and the second slot are filled with a conductive material to form a first electrode and a second electrode of the capacitor respectively.

According to one embodiment, the depth of the second slot is smaller than the depth of the first slot.

One feature of the present invention is that the intra-metal capacitor is formed in the same dielectric layer by a multi-mask approach, wherein multiple patterning processes utilizing these mask individually are carried out to form the intra-metal capacitor. Unlike the conventional method of forming the electrodes of the intra-metal capacitor in the same patterning process using a single photo mask, the spacing between the electrodes of the intra-metal capacitor of the present invention may be adjustable without concerning the photolithographic resolution limitation of the patterning process. Therefore, an inter-metal capacitor with a thinner intermediate insulating layer and consequently an enlarged capacitance may be achieved. A larger degree of size minimization of the intra-metal capacitor may also be realizable.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
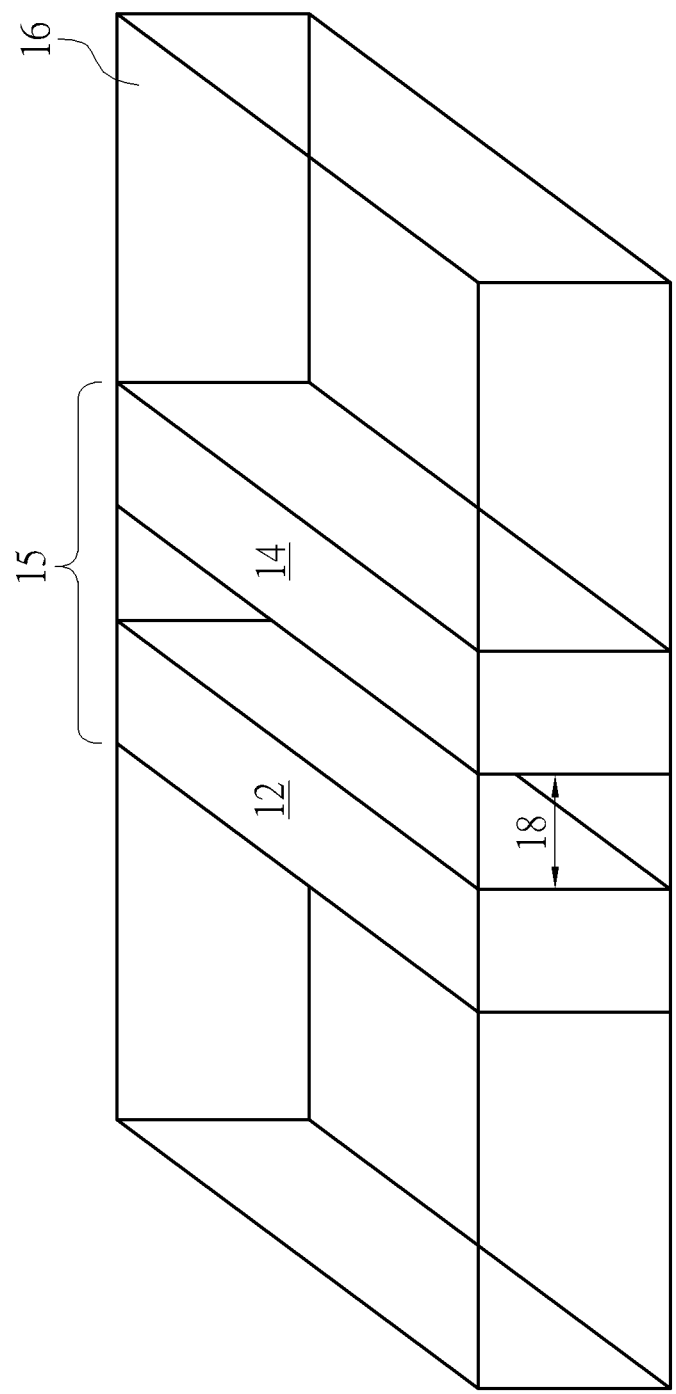
FIG. 1 is a schematic diagram exemplarily showing a conventional intra-metal capacitor structure.

In the following detailed description, reference is made to the accompanying drawings which form a part hereof, and in which is shown, by way of illustration of specific embodiments in which the invention may be practiced. These embodiments are described in sufficient detail to enable those skilled in the art to practice the invention. Other embodiments may be utilized and that structural, logical and electrical changes may be made without departing from the spirit and scope of the present invention.

One or more implementations of the present invention will now be described with reference to the attached drawings, wherein like reference numerals are used to refer to like elements throughout, and wherein the illustrated structures are not necessarily drawn to scale.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 2:
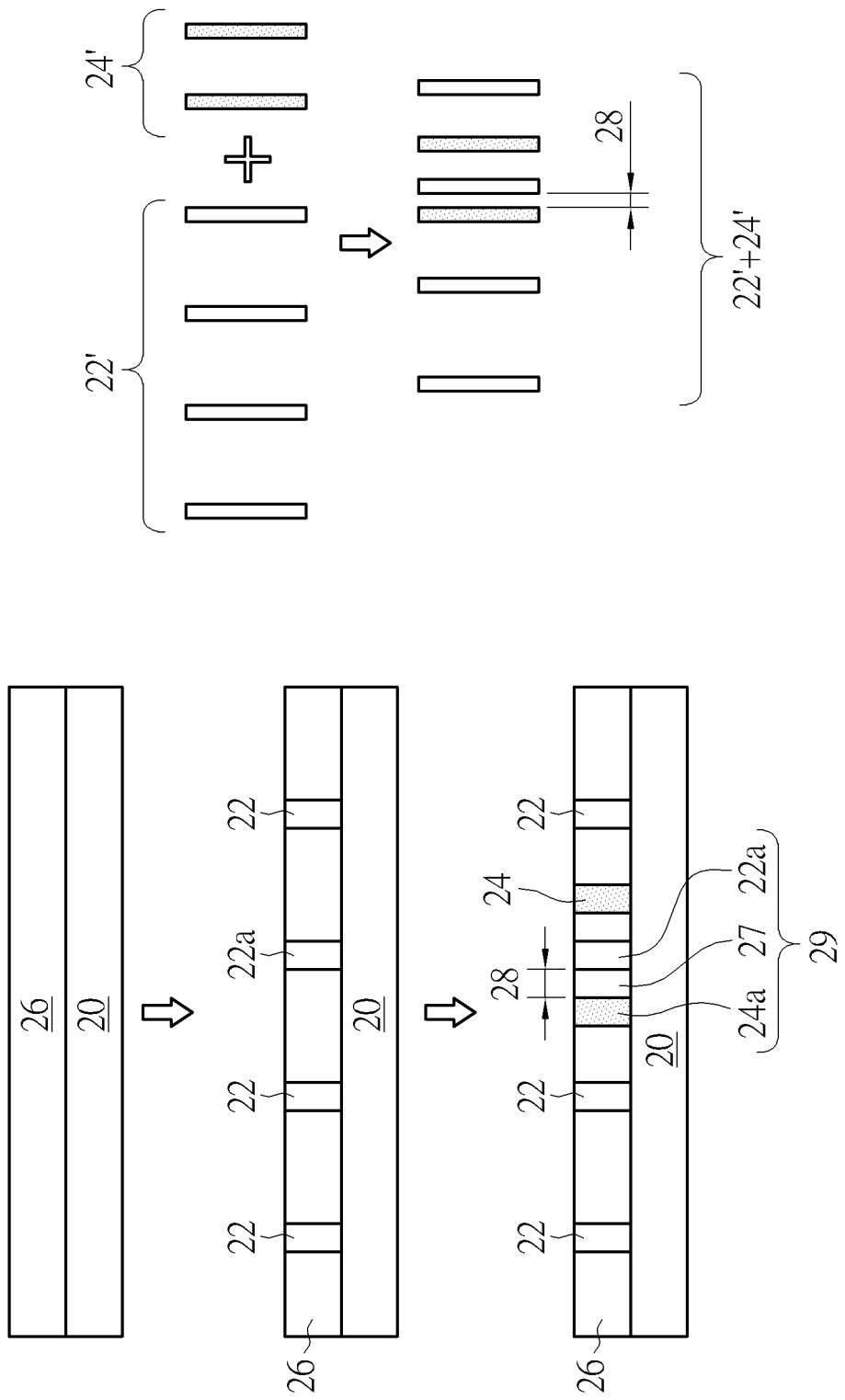
FIG. 2 is a schematic diagram illustrating the generic concept of forming the intra-metal capacitor by a multi-mask approach and multi-patterning process according to the present invention.

Please refer to FIG. 2, which is a schematic diagram illustrating the generic concept of the present invention wherein an intra-metal capacitor 29 is formed in the dielectric layer 26 on the substrate 20 by a multi-mask approach. The right part of FIG. 2 exemplarily shows the overlaying of two photo masks 22' and 24' to form a composite target pattern comprising the pattern of the intra-metal capacitor. The left part of FIG. 2 exemplarily shows that multiple patterning processes individually utilizing one of the masks 22' and 24' are performed to form the structure comprising the intra-metal capacitor 29 in the dielectric layer 26.

As shown in FIG. 2, first, a substrate 20 is provided with a dielectric layer 26 formed thereon. According to one embodiment, the substrate 20 may comprise semiconductor devices (not shown) or interconnecting structures such as metal lines or plugs (not shown) formed therein or thereon. The top surface of the substrate 20 is completely covered by the dielectric layer 26. A first patterning process using the mask 22' is then performed to define a plurality of first conductive structures 22 and 22a in the dielectric layer 26. After that, a second patterning process using the other mask 24' is performed to define a plurality of second conductive structures 24 and 24a in the dielectric layer 26. The first conductive structures 22, 22a and the second conductive structures 24, 24a may comprise the same materials, such as tungsten, copper and aluminum, but not limited thereto. According to the embodiment, the first conductive structures 22, 22a and the second conductive structures 24, 24a may be interleaved with each other, wherein the first conductive structure 22a and the second conductive structure 24a are arranged in a close proximity with a pre-determined distance 28 to each other to be able to capacitively coupled through the portion of the dielectric layer sandwiched between their adjacent sidewalls, that is, the intermediate dielectric layer 27. In other words, the closely arranged first conductive structure 22a and the second conductive structures 24a and the intermediate dielectric layer 27 collectively form the intra-metal capacitor 29, wherein the first conductive structure 22a and the second conductive structures 24a function as the two electrodes.

As shown in FIG. 2, the two "electrodes" 22a and 24a of the intra-metal capacitor 29 are formed side-by side in the dielectric layer 26 and are spaced apart by the intermediate dielectric layer 27 which has a thickness determined by the distance 28 between the adjacent sidewalls of the electrodes 22a and 24a. One advantage of the present invention is that, the distance 28 is substantially not limited to the resolution limitations of either the first patterning process or the second patterning process. In other words, the distance 28 between the two electrodes 22a and 24a of the intra-metal capacitor 29 maybe formed smaller than the critical dimension (or minimum pitch) of the first patterning process and the second patterning process. Therefore, the capacitance of the intra-metal capacitor 29 may be conveniently adjusted by varying the distance 28 between the two electrodes 22a and 24a according to design needs without concerning the resolution limitations (or minimum pitch).

It should be understood that although not illustrate hereinabove, the process of forming the first conductive structures 22, 22a and the second conductive structures 24, 24a may be a 2P2E1D process (2 photolithography-2 etching-1 conductive material filling) or a 2P1E1D process (2 photolithography-1 etching-1 conductive material filling). As long as the "patterns" of the first conductive structures 22, 22a and the second conductive structures 24, 24a are defined in the dielectric layer using different photo masks 22' and 24', it is included in the scope of the present invention.

Figure 3:
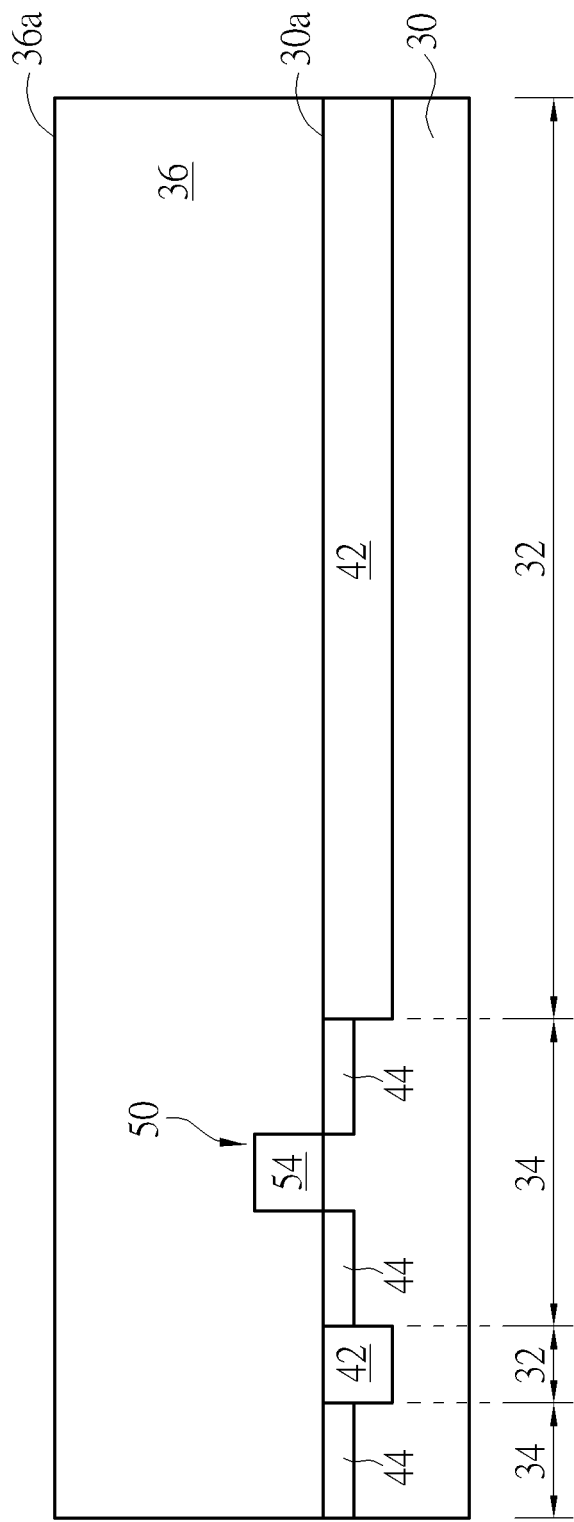
FIG. 3 to FIG. 5 are schematic diagrams illustrating a first embodiment of forming an intra-metal capacitor according to the present invention.
Figure 4:
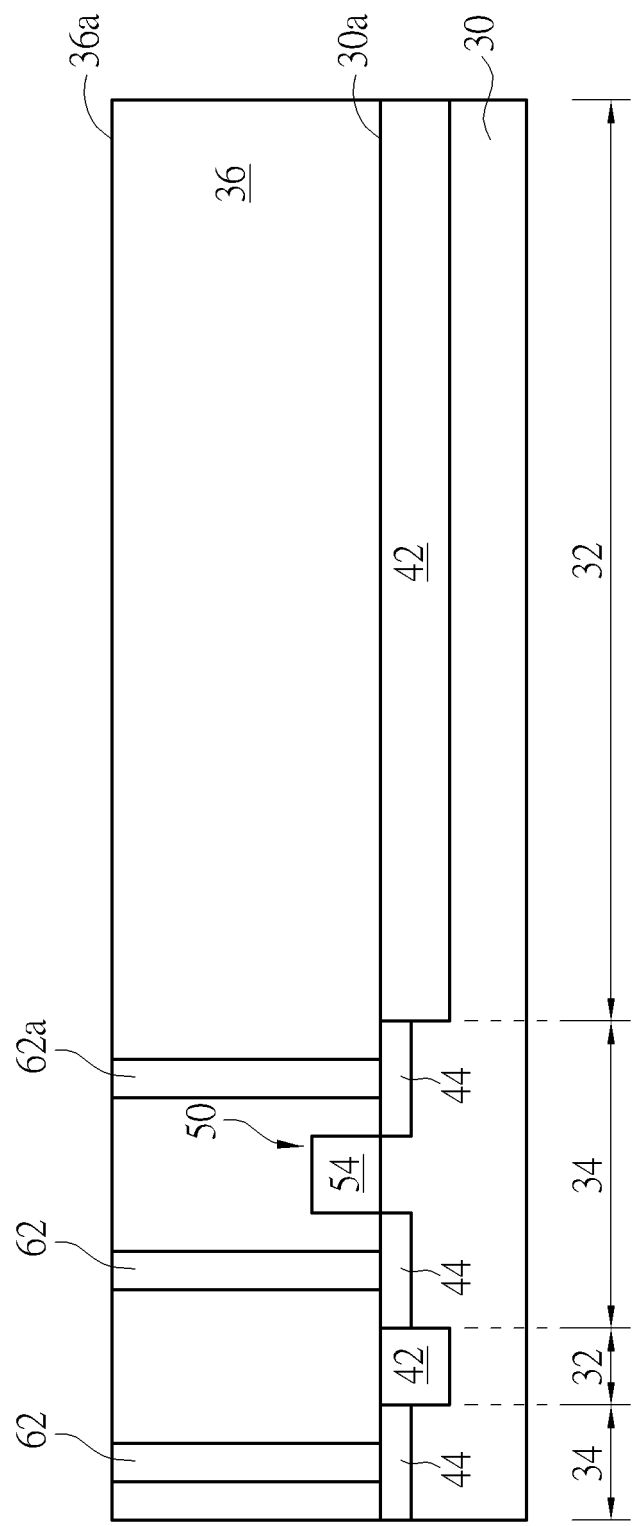
Figure 5:
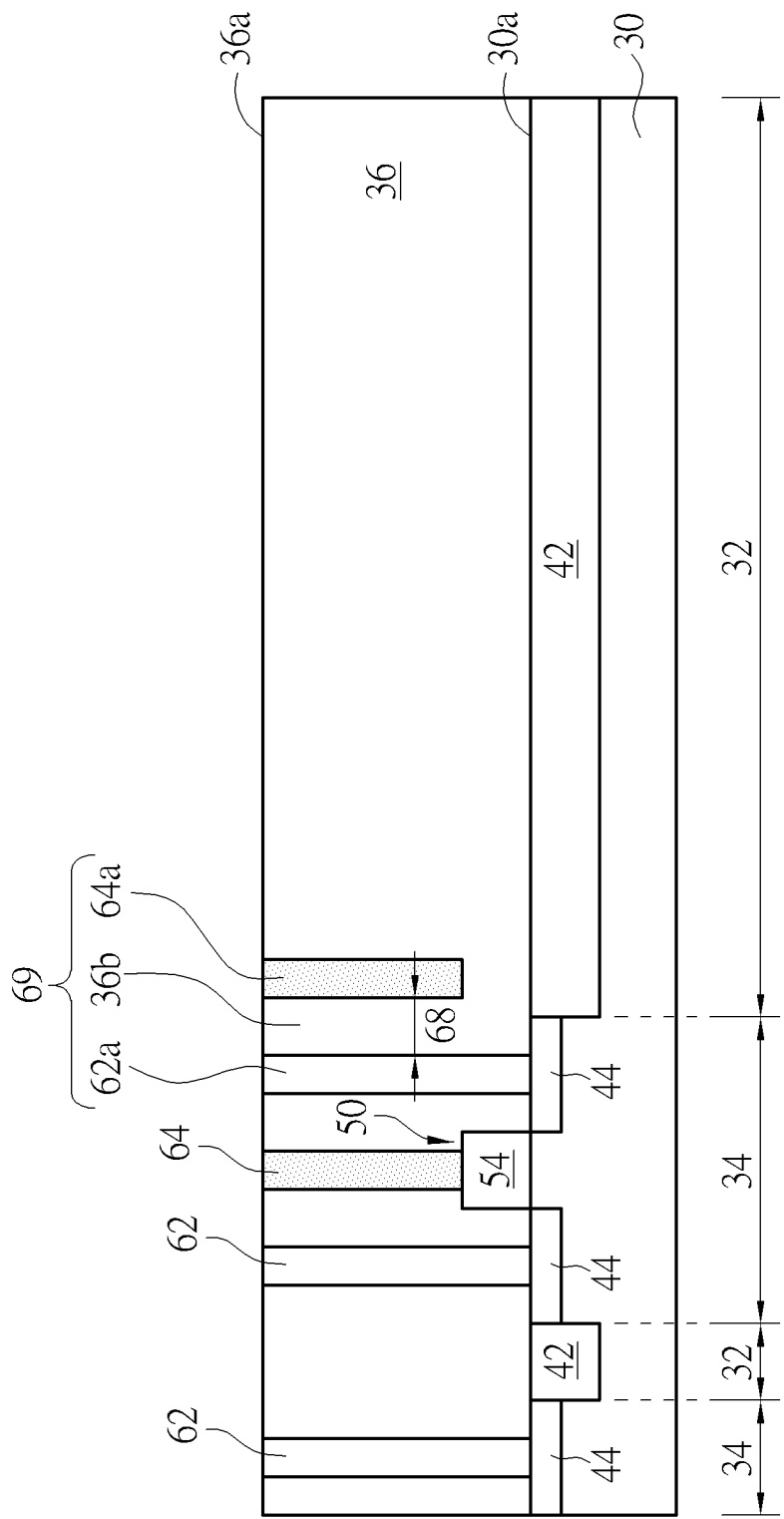

FIG. 3 to FIG. 5 are schematic diagrams illustrating a first embodiment of forming an intra-metal capacitor according to the present invention. In the embodiment, the intra-metal capacitor is formed integrated with the formation of the device contact plugs.

Please refer to FIG. 3. Similarly, a substrate 30 is provided. A dielectric layer 36 is formed covering the main surface 30a of the substrate 30. The substrate 30 may comprise a silicon substrate, SOI substrate, silicon germanium substrate or silicon carbide substrate, but not limited thereto. According to the embodiment, the substrate 30 may comprise at least an active region 34 and an isolation region 32 adjacent to the active region 34. The active region 44 34 may comprise at least a semiconductor device 50 and/or at least a doped region 44 formed therein. An isolation structure 42, such as a shallow trench isolation (STI) structure, may be formed in the isolation region 32 to electrically isolate the semiconductor device 50 and/or the doped region 44 formed in different active regions 34.

The semiconductor device 50 maybe a metal-oxide-semiconductor field-effect transistor (MOSFET), a bipolar junction transistor (BJT), a diode, a resistor, a capacitor, or any other devices which may be fabricated on the substrate 30. According to the embodiment, the semiconductor device 50 may have a conducting structure 54 having a thickness formed above the main surface 30a of the substrate 30. The conducting structure 54 may comprise metals or semiconductor materials such as polysilicon, and may function as a gate electrode, a conductive segment for interconnection or a resistor segment of the semiconductor device 50, but not limited thereto.

The doped region 44 may be a source/drain region, a substrate butting region, a current drift region or a resistor region of the semiconductor device 50, but not limited thereto. The doped region 44 maybe formed in the substrate 30 by conventional ion implantation process or epitaxial growing process. The doped region 44 is exposed from the main surface 30a of the substrate 30 to be electrically connected with other interconnecting structures, such as contact plugs. According to the embodiment, the dielectric layer 36 is an interlayer dielectric (ILD) layer with a substantially flat upper surface 36a. Optionally, the dielectric layer 36 may have a barrier layer or a contact etching stop layer (not shown) formed along the interface between the dielectric layer 36 and the substrate 30.

Figure 8:
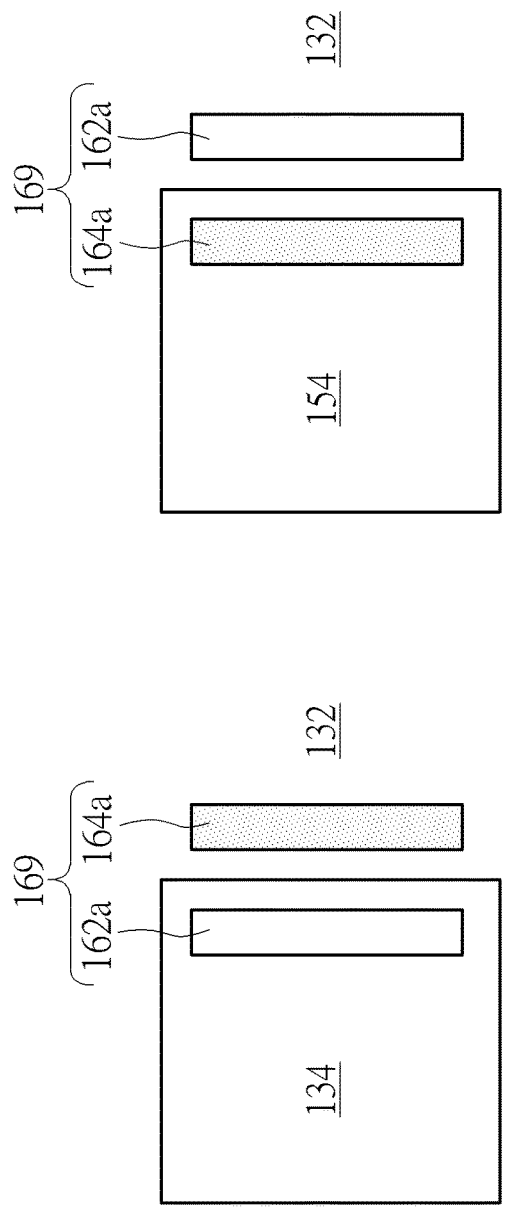
FIG. 8 comprises schematic top-view diagrams showing various arrangements of the intra-metal capacitor according to other embodiments of the present invention.
Figure 8:
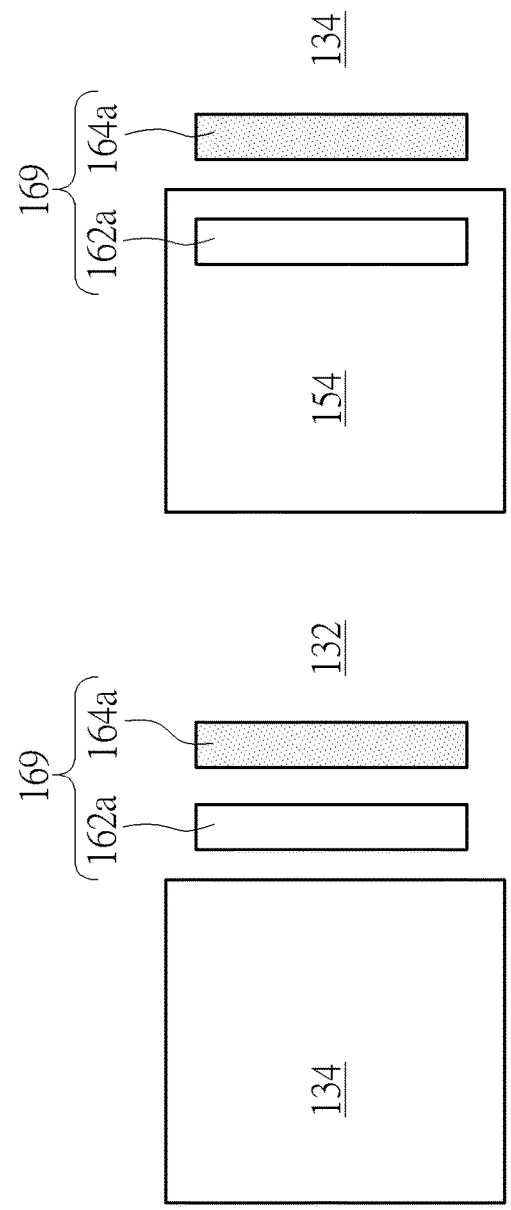
Figure 9:
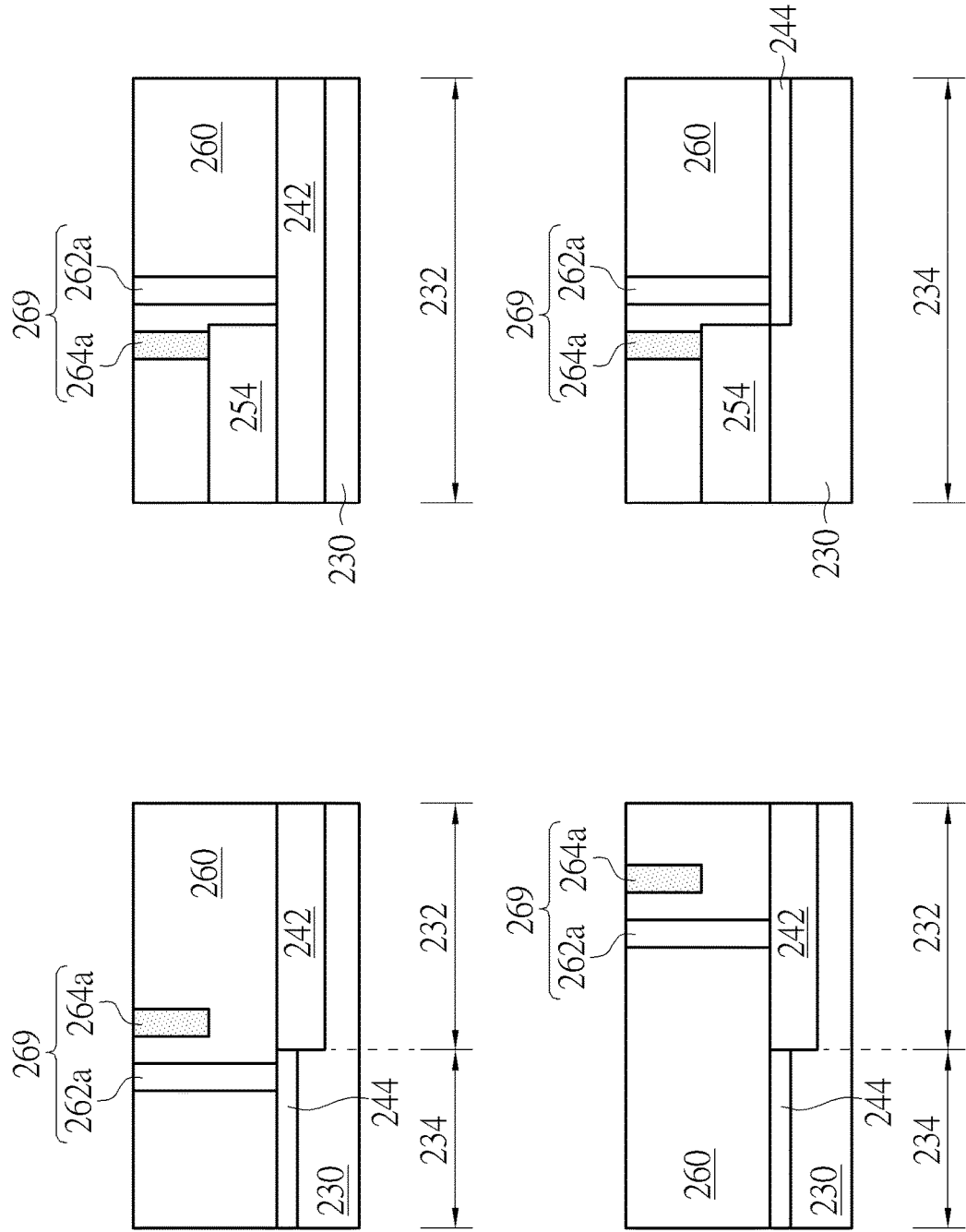
FIG. 9 comprises schematic cross-sectional diagrams showing various arrangements of the intra-metal capacitor in correspondence with FIG. 8.

Please refer to FIG. 4. A first patterning process is performed to form a plurality of the first device contact plugs 62 and a first contact plug 62a in the dielectric layer 36. According to the embodiment, the first device contact plugs 62 and the first contact plug 62a may extend through the whole thickness of the dielectric layer 36 and electrically connect with the doped regions 44, for example, the source/drain regions. According to the embodiment, the top end of the first device contact plugs 62 and the first contact plug 62a are both exposed from the upper surface 36a of the dielectric layer 36 to be further connected with other interconnecting structures such as vias or metal lines formed in the following process. The bottom ends of the first device contact plugs 62 and the first contact plugs 62a are in direct contact with the main surface 30a of the substrate 30. It should be noticed that although in the embodiment as shown in FIG. 4, the bottom ends of the first device contact plugs 62 and the first contact plug 62a are both landing on and in direct contact with the doped region 44, in other embodiments as shown in FIG. 8 and FIG. 9 (will be illustrated later), the bottom end of the first contact plug 62a may land on the isolation region 32 rather than land on the doped region 44. Optionally, a silicide layer (not shown) may be formed in the doped region 44 to be the contacting interface for a lower contacting resistance.

Please refer to FIG. 5. Subsequently, a second patterning process is performed to form a plurality of second device contact plugs 64 and second contact plug 64a in the dielectric layer 36. According to the embodiment, the second device contact plugs 64 may be electrically connected with the conducting structure 54, for example, to be a gate contact. It should be noticed that the second device contact plugs 64 and the second contact plug 64a do not penetrate through the whole thickness of the dielectric layer 36. As shown in FIG. 5, the top ends of the second device contact plugs 64 and the second contact plug 64a are flush with the top ends of the first device plugs 62 and the first contact plug 62a, and also exposed from the upper surface 36a of the dielectric layer 36. The bottom ends of the second device contact plugs 64 and the second contact plug 64a are at a position above the main surface 30a of the substrate, and do not come in direct contact with the main surface 30a. According to the embodiment, the bottom end of the second device contact plug 64 lands on the top portion of the conducting structure 54 and electrically connects with the conducting structure 54. It is noteworthy that the bottom end of the second contact plugs 64a is substantially suspended at a position in the dielectric layer 36 over the main surface 30a. Preferably, the heights of the second contact plugs 64 and 64a are the same. According to the embodiment, the first contact plug 62a and the second contact plug 64a are disposed in a close distance 68 from each other such that a significant amount of capacitance may be obtained through the capacitive coupling between the first contact plug 62a and the second contact plug 64a through the intermediate insulating layer 36a. The first contact plug 62a, the second contact plug 64a and the intermediate insulating layer 36b are configured to collectively form an intra-metal capacitor 69, wherein the first contact plug 62a and the second contact plugs 64a are the two electrodes respectively. The capacitance of the intra-metal capacitor 69 may be adjustable by varying the thickness of the intermediate insulating layer 36b, that is, by varying the distance 68 between the first contact plug 62a and the second contact plug 64a. According to one embodiment of the present invention, the thickness of the intermediate insulating layer 36a (also the distance 68) is smaller than 50 nm, preferably, is smaller than 25 nm. It should be understood that the dimensions (or width) of the first device contact plugs 62, the first contact plug 62a, the second device contact plugs 64, and the second contact plug 64a may be the same or different based on design needs.

As illustrated previously, the first contact plug 62a and the second contact plug 64a are formed in different patterning processes. By this method, the distance 68 between them may be adjustable without concerning the resolution limitation (or called minimum pitch) of each of the patterning process, and it is possible to form the distance 68 beyond the resolution limitation of the patterning processes. A larger capacitance of the intra-metal capacitor 69 may be correspondingly achieved by disposing the first contact plug 62a and the second contact plus 64a in close proximity to form thinner intermediate insulating layer 36a. It is also noteworthy that the electrode 62a of the intra-metal capacitor 69 is also a connecting plug for the doped region 44, wherein the intra-metal capacitor 69 according to the present invention may be conveniently utilized by the semiconductor device 50.

Figure 6:
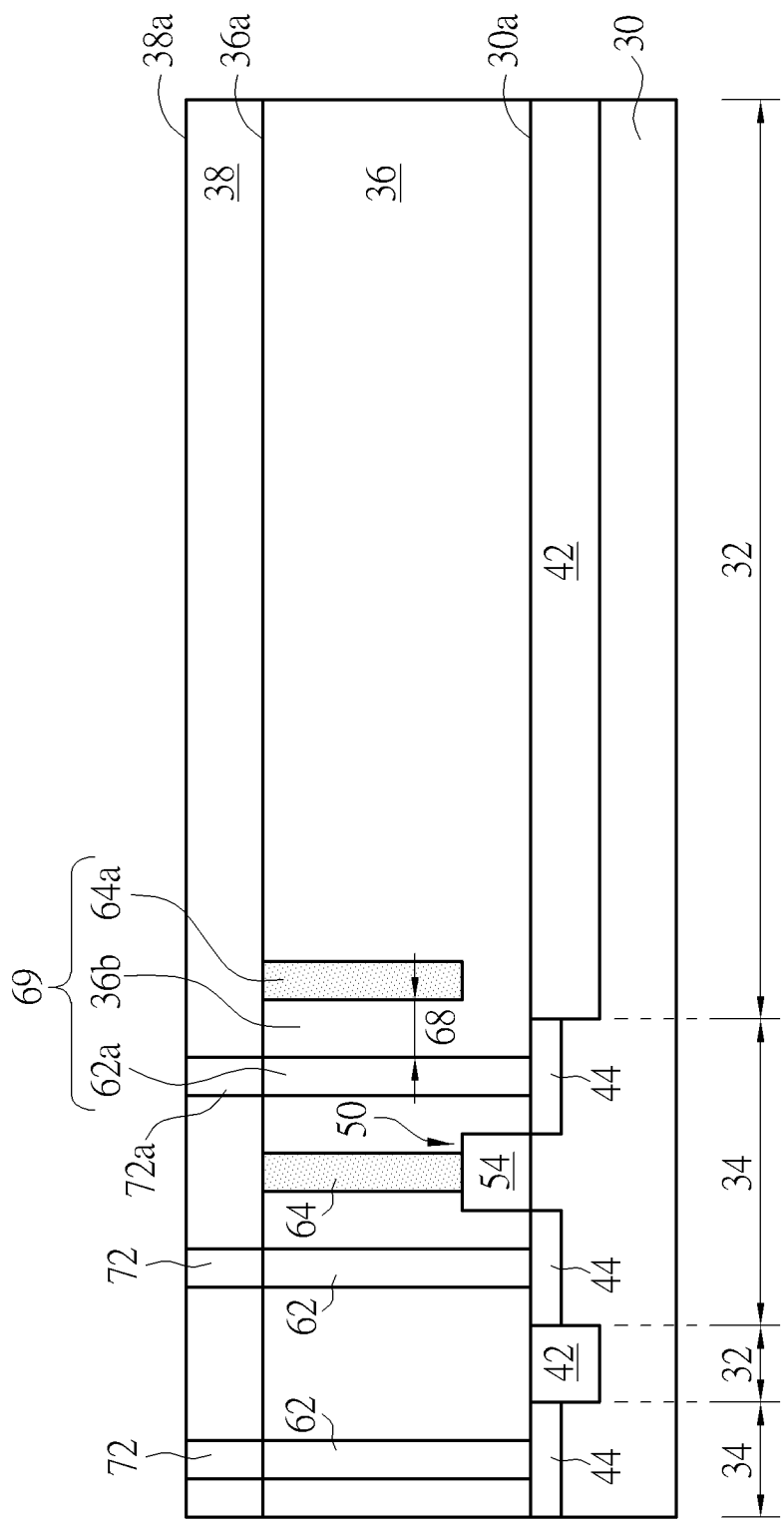
FIG. 6 to FIG. 7 are schematic diagrams illustrating a second embodiment of forming an intra-metal capacitor according to the present invention, wherein the intra-metal capacitor may have an enlarged capacitance.
Figure 7:
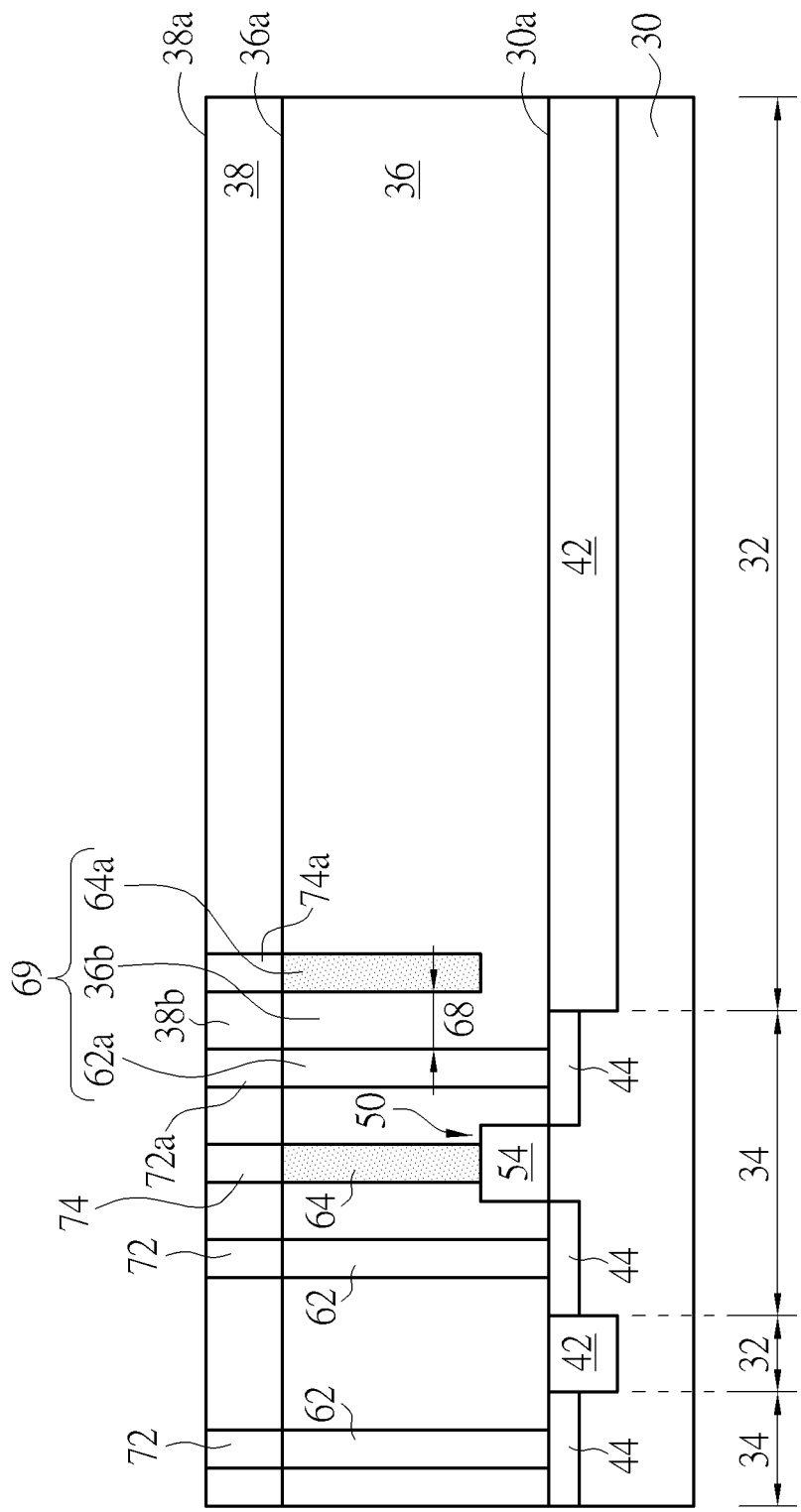

Please refer to FIG. 6 to FIG. 7, which illustrate a second embodiment of the present invention. In the second embodiment, a larger capacitance may be obtained by stacking other layers of conductive structures, such as metal or vias, over the first contact plug 62a and the second contact plug 64a.

According to the second embodiment, another dielectric layer 38 is formed on the dielectric layer 36. Similarly, a plurality of first metal structures 72, 72a and a plurality of second metal structures 74, 74a are formed in the dielectric layer 38 successively by two patterning process as shown in FIG. 6 and FIG. 7. The first metal structures 72, 72a and second metal structures 74, 74a penetrate through the whole thickness of the dielectric layer 38. The top ends of the first metal structures 72, 72a and the second metal structures 74, 74a are all exposed from the upper surface 38a of the dielectric layer 38 for further interconnection. The bottom ends of the first metal structures 72, 72a and the second metal structures 74, 74a are flush with each other and in direct contact with the corresponding first device contact plug 62, the first contact plug 62a, the second device contact plug 64 and the second contact plug 64a respectively. According to the embodiment, the first metal structure 72a over the first contact plug 62a and the second metal structure 74a over the second contact plug 64a are also capacitively coupled through the intermediate insulating layer 38b to provide another significant amount of capacitance. Consequently a larger overall capacitance is obtained. It should be understood that the dimensions of the first metal structures 72, 72a and the second metal structures 74, 74a may be the same or different.

Please refer to FIG. 8 and FIG. 9, which illustrate various arrangements of the intra-metal capacitor according to other embodiments of the present invention.

As shown in FIG. 8, various arrangements of the first contact plug 162a (the first electrode of the capacitor 169) and the second contact plug 164a (the second electrode of the capacitor 169) are provided in regard to the active region 134, the isolation region 132 and the conducting structure 154 over either the active region 134 or the isolation region 132 from the top views. It should be understood that the shapes shown in the top views of the first contact plug 162a and the second contact plug 164a are exemplary. Other shapes may be also applicable.

In a first arrangement, the capacitor 169 is disposed across the boundary of the active region 134 and the isolation region 132. For example, as shown in the upper-left part of FIG. 8, the first contact plug 162a is formed completely within the area over the active region 134 and the second contact plug 164a is formed completely within the area over the isolation region 132. It should be understood that the position of the first contact plug 162a and the second contact plug 164a may be exchanged. In a second arrangement, the capacitor 169 is completely disposed over the isolation region 132, as shown in the lower-left part of FIG. 8. In a third arrangement, as shown in the upper-right part of FIG. 8, a conducting structure 154 is directly disposed over the isolation region 132, and the capacitor 169 is disposed across the edge of the conducting structure 154, wherein the first contact plug 162a is disposed completely within the area above the isolation region 132 and the second contact plug 164a is disposed completely within the area above the conducting structure 154. In a fourth arrangement, as shown in the lower-right part of FIG. 8, a conducting structure 154 is directly disposed over the active region 134, and the capacitor 169 is disposed across the edge of the conducting structure 154, wherein the first contact plug 162a is disposed completely within the area above the active region 134 and the second contact plug 164a is disposed completely within the area above the conducting structure 154.

Please refer to FIG. 9, which comprises schematic cross-sectional diagrams showing various arrangements of the intra-metal capacitor in correspondence with FIG. 8.

Similarly, in a first arrangement, the capacitor 269 is disposed across the boundary of the doped region 244 and the isolation structure 242. As shown in the upper-left part of FIG. 9, the first contact plug 262a is formed completely within the area over the doped region 244 and the second contact plug 264a is formed completely within the area over the isolation structure 242. It should be understood that the position of the first contact plug 262a and the second contact plug 264a may be exchanged. In a second arrangement, the capacitor 269 is completely disposed over the isolation structure 242, as shown in the lower-left part of FIG. 9. In a third arrangement, as shown in the upper-right part of FIG. 9, a conducting structure 254 is directly disposed over the isolation structure 242, and the capacitor 269 is disposed across the edge of the conducting structure 254, wherein the first contact plug 262a is disposed only over the isolation structure 242 and the second contact plug 264a is disposed over the conducting structure 254. In a fourth arrangement, as shown in the lower-right part of FIG. 9, a conducting structure 254 is disposed over the substrate 230 and adjacent to the doped region 244, wherein the capacitor 269 is disposed across the edge of the conducting structure 254 with the first contact plug 262a disposed over the doped region 244 and the second contact plug 264a disposed over the conducting structure 254.

It should be understood that although the intra-metal capacitors shown in the embodiments illustrated previously comprise two electrodes (plates), the present invention is also applicable to form intra-metal capacitors having multi-layers of electrodes, wherein a plurality of the first electrodes and a plurality of the second electrodes are interleaved in the dielectric layer to form a plurality of serial-connected capacitors.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a semiconductor structure, comprising:
    providing a substrate having a conducting structure disposed thereon;
    forming a dielectric layer over the substrate and the conductive structure;
    performing a first patterning process to form a first contact plug through the whole thickness of the dielectric layer and directly contacting the substrate; and
    performing a second patterning process to form a device contact plug and a second contact plug in the dielectric layer, a bottom end of the device contact plug directly contacting the conductive structure, a bottom end of the second contact plug being completely covered by the dielectric layer, the second contact plug being in close proximity to one side of the first contact plug and spaced apart from the first contact plug in a predetermined distance, wherein the first contact plug and the second contact plug and a portion of the dielectric layer sandwiched therebetween are configured to form a capacitor, wherein the first contact plug and the second contact plug are two electrodes of the capacitor, respectively.

2. The method of forming a semiconductor structure according to claim 1, wherein a top end of the second contact plug is flush with a top end of the first contact plug, and a bottom end of the second contact plug is at a horizontal level higher than a bottom end of the first contact plug.

3. The method of forming a semiconductor structure according to claim 1, wherein the substrate comprises an isolation region and an active region bordering the isolation region, and a semiconductor device is formed on the active region of the substrate before forming the dielectric layer.

4. The method of forming a semiconductor structure according to claim 3, wherein an another device contact plug is formed in the dielectric layer by the first patterning process to electrically connect to the semiconductor device.

5. The method of forming a semiconductor structure according to claim 4, wherein the semiconductor device is further electrically connected to the first contact plug.

6. The method of forming a semiconductor structure according to claim 1, wherein the first contact plug, the second contact plug and the device contact plugs comprise a same conductive material.

7. The method of forming a semiconductor structure according to claim 3, wherein the first contact plug and the second contact plug are formed completely above the isolation region of the substrate.

8. The method of forming a semiconductor structure according to claim 1, wherein a pre-determined thickness of the dielectric layer sandwiched between the first contact plug and the second contact plug is determined by the pre-determined distance between the first contact plug and the second contact plug which is smaller than a photolithographic resolution limitation of the first patterning process and the second patterning process.

9. The method of forming a semiconductor structure according to claim 3, wherein a bottom end of the first contact plug is electrically isolated by being disposed on the isolation region of the substrate.

10. The method of forming a semiconductor structure according to claim 1, wherein a bottom end of the second contact plug is electrically isolated by being completely covering by the dielectric layer.

* * * * *